United States Patent
Boorse et al.

(10) Patent No.: US 8,293,182 B2
(45) Date of Patent: Oct. 23, 2012

(54) INTEGRATED SCR AND AMOX CATALYST SYSTEMS

(75) Inventors: R. Samuel Boorse, Skillman, NJ (US);
Matthew T. Caudle, Hamilton, NJ (US);
Martin Dieterle, Jersey City, NJ (US);
Sanath V. Kumar, Hillsborough, NJ (US); Kenneth E. Voss, Somerville, NJ (US)

(73) Assignee: BASF Corporation, Florham Park, NJ (US)

(*) Notice: Subject to any disclaimer, the term of this patent is extended or adjusted under 35 U.S.C. 154(b) by 198 days.

(21) Appl. No.: 12/774,469

(22) Filed: May 5, 2010

(65) Prior Publication Data
US 2011/0271664 A1 Nov. 10, 2011

(51) Int. Cl.
*B01D 50/00* (2006.01)
(52) U.S. Cl. .................................................... 422/180
(58) Field of Classification Search ............... 422/177, 422/180; 60/297, 299
See application file for complete search history.

(56) References Cited

U.S. PATENT DOCUMENTS

| | | | |
|---|---|---|---|
| 4,010,238 A | 3/1977 | Shiraishi et al. | |
| 4,085,193 A | 4/1978 | Nakajima et al. | |
| 4,329,162 A | 5/1982 | Pitcher, Jr. | |
| 5,185,305 A * | 2/1993 | Subramanian et al. | 502/65 |
| 6,162,415 A | 12/2000 | Liu et al. | |
| 7,264,789 B1 | 9/2007 | Verduijn et al. | |
| 7,481,983 B2 | 1/2009 | Patchett et al. | |
| 7,601,662 B2 | 10/2009 | Bull et al. | |
| 2010/0058746 A1* | 3/2010 | Pfeifer et al. | 60/297 |
| 2010/0111796 A1* | 5/2010 | Caudle et al. | 423/239.2 |
| 2010/0150790 A1* | 6/2010 | Zuberi | 422/171 |
| 2010/0175372 A1* | 7/2010 | Lambert et al. | 60/297 |
| 2011/0179777 A1* | 7/2011 | Chandler et al. | 60/297 |

FOREIGN PATENT DOCUMENTS
JP 2007239752 9/2007
* cited by examiner

*Primary Examiner* — Tom Duong
(74) *Attorney, Agent, or Firm* — Melanie L. Brown (57) ABSTRACT

Catalysts and catalytic articles for treating exhaust gas streams are described. In one or more embodiments, a catalyst system includes a first zone to abate nitrogen oxides by selective catalytic reduction, a second zone to oxidize ammonia and a third zone to oxidize carbon monoxide and hydrocarbons. Methods for treating the exhaust gas stream are also provided. Methods of making and using such catalysts and catalytic articles are also described.

15 Claims, 2 Drawing Sheets

INTEGRATED SCR AND AMOX CATALYST SYSTEMS

TECHNICAL FIELD

The invention pertains to catalysts, methods for their manufacture, and methods of treating emissions in an exhaust stream.

BACKGROUND

Diesel engine exhaust is a heterogeneous mixture that contains particulate emissions such as soot and gaseous emissions such as carbon monoxide, unburned or partially burned hydrocarbons, and nitrogen oxides (collectively referred to as $NO_x$), but also condensed phase materials (liquids and solids) which constitute the so-called particulates or particulate matter. Catalyst compositions, often disposed on one or more monolithic substrates, are placed in engine exhaust systems to convert certain or all of these exhaust components to innocuous compounds. For example, diesel exhaust systems can contain one or more of a diesel oxidation catalyst, a soot filter and a catalyst for the reduction of $NO_x$.

Oxidation catalysts that contain platinum group metals, base metals and combinations thereof are known to facilitate the treatment of diesel engine exhaust by promoting the conversion of both HC and CO gaseous pollutants and some proportion of the particulate matter through oxidation of these pollutants to carbon dioxide and water. Such catalysts have generally been contained in units called diesel oxidation catalysts ("DOC"), which are placed in the exhaust of diesel engines to treat the exhaust before it vents to the atmosphere. Such catalysts are also contained in units called catalyzed soot filters which simultaneously trap particulate matter and oxidize HC, CO and particulates. In addition to the conversions of gaseous HC, CO and particulate matter, oxidation catalysts that contain platinum group metals (which are typically dispersed on a refractory oxide support) promote the oxidation of nitric oxide (NO) to $NO_2$.

Ammonia selective catalytic reduction (SCR) is a $NO_x$ abatement technology that will be used to meet strict $NO_x$ emission targets in diesel and lean-burn engines. In the ammonia SCR process, $NO_x$ (normally consisting of $NO+NO_2$) is reacted with ammonia (or an ammonia precursor such as urea) to form dinitrogen ($N_2$) over a catalyst typically composed of base metals. This technology is capable of $NO_x$ conversions greater than 90% over a typical diesel driving cycle, and thus it represents one of the best approaches for achieving aggressive $NO_x$ abatement goals.

A characteristic feature of some ammonia SCR catalyst materials is a propensity to retain considerable amounts of ammonia on Lewis and Brønsted acidic sites on the catalyst surface during low temperature portions of a typical driving cycle. A subsequent increase in exhaust temperature can cause ammonia to desorb from the ammonia SCR catalyst surface and exit the exhaust pipe of the vehicle. Overdosing ammonia in order to increase $NO_x$ conversion rate is another potential scenario where ammonia may exit from the ammonia SCR catalyst.

Ammonia slip from the ammonia SCR catalyst presents a number of problems. The odor threshold for $NH_3$ is 20 ppm in air. Eye and throat irritation are noticeable above 100 ppm, skin irritation occurs above 400 ppm, and the IDLH is 500 ppm in air. $NH_3$ is caustic, especially in its aqueous form. Condensation of $NH_3$ and water in cooler regions of the exhaust line downstream of the exhaust catalysts will give a corrosive mixture.

Therefore, it is desirable to eliminate the ammonia before it can pass into the tailpipe. A selective ammonia oxidation (AMOx) catalyst is employed for this purpose, with the objective to convert the excess ammonia to $N_2$. It would be desirable to provide a catalyst for selective ammonia oxidation that is able to convert ammonia at a wide range of temperatures where ammonia slip occurs in the vehicles driving cycle, and can produce minimal nitrogen oxide byproducts. The AMOx catalyst should also produce minimal $N_2O$, which is a potent greenhouse gas.

SUMMARY

Aspects of the invention include catalytic articles, catalyst systems for treating an exhaust gas stream, and methods of preparing catalytic articles for the treatment of such gas. A first aspect pertains to a catalytic article for treating an exhaust gas stream containing particulate matter, hydrocarbons, CO and ammonia. In one or more embodiments, the article comprises a substrate having an inlet end and an outlet end defining an axial length a first catalyst coating including a platinum group metal, the first catalyst coating extending from the outlet end toward the inlet end over less than the entire axial length of the substrate; and a second catalyst coating including a catalyst for selective catalytic reduction (SCR) of nitrogen oxides, the second catalyst coating extending from the inlet end toward the outlet end over less than the entire axial length of the substrate and overlapping a portion of the first catalyst coating. In one or more embodiments, the substrate is a flow-through substrate having a plurality of longitudinally extending passages formed by longitudinally extending walls bounding and defining said passages. In other embodiments, the substrate is a wall-flow filter having gas permeable walls formed into a plurality of axially extending channels, each channel having one end plugged with any pair of adjacent channels plugged at opposite ends thereof.

According to one or more embodiments, at least a portion of the platinum group metal is on a particulate refractory metal oxide support. In specific embodiments, the platinum group metal is platinum. In one or more specific embodiments, the first catalyst coating and second catalyst coating overlap to form three zones, a first zone to remove NOx by selective catalytic reduction, a second zone to oxidize ammonia and a third zone to oxidize carbon monoxide and hydrocarbons. In more specific embodiments, each of the three zones individually occupies in the range of about 10 to about 80% of the axial length of the substrate. In one or more embodiments, the platinum group metal is directly supported on the substrate walls.

Another aspect of the invention pertains to an emissions treatment system comprising a diesel engine emitting an exhaust stream including particulate matter, NOx and carbon monoxide; and a first substrate having an inlet end and an outlet end defining an axial length positioned downstream of and in flow communication with the diesel engine, the substrate having a first catalyst coating including a platinum group metal, the first catalyst coating extending from the outlet end toward the inlet end over less than the entire axial length of the substrate, and a second catalyst coating including a catalyst for selective catalytic reduction (SCR) of nitrogen oxides, the second catalyst coating extending from the inlet end toward the outlet end over less than the entire axial length of the substrate and overlapping a portion of the first catalyst coating layer. In one or more embodiments of the system, the first substrate is selected from the group consisting of a wall-flow substrate and a flow-through substrate.

In one or more embodiments of the system, at least a portion of the platinum group metal is on refractory metal oxide support and/or the platinum group metal is platinum. According to one or more system embodiments, there is an upstream substrate coated with a catalyst for selective catalytic reduction of nitrogen oxides disposed in flow communication with the exhaust stream and between the diesel engine and the first substrate. In specific system embodiments, the upstream substrate comprises a honeycomb flow-through substrate. In one or more system embodiments, the upstream substrate comprises a wall flow filter substrate having gas permeable walls formed into a plurality of axially extending channels, each channel having one end plugged with any pair of adjacent channels plugged at opposite ends thereof.

According to one or more system embodiments, the first catalyst and second catalyst overlap to form three zones, a first zone to abate nitrogen oxides by selective catalytic reduction, a second zone to oxidize ammonia and a third zone to oxidize carbon monoxide and hydrocarbons, and the platinum group metal is directly supported on the substrate walls in the first zone and the third zone. In specific system embodiments, the first substrate comprises a honeycomb flow through substrate and the first catalyst and second catalyst overlap to form three zones, a first zone to abate nitrogen oxides by selective catalytic reduction, a second zone to oxidize ammonia and a third zone to oxidize carbon monoxide and hydrocarbons, and at least a portion of the platinum group metal is on a particulate refractory oxide support. In one or more system embodiments, the first substrate is a wall flow filter substrate having gas permeable walls formed into a plurality of axially extending channels, each channel having one end plugged with any pair of adjacent channels plugged at opposite ends thereof.

According to one or more system embodiments, there is a wall flow filter substrate having gas permeable walls formed into a plurality of axially extending channels, each channel having one end plugged with any pair of adjacent channels plugged at opposite ends thereof coated with a hydrocarbon or CO oxidation catalyst disposed in flow communication with the exhaust stream and between the diesel engine and the porous substrate. In specific system embodiments, the first catalyst and second catalyst overlap to form three zones, a first zone to abate nitrogen oxides by selective catalytic reduction, a second zone to oxidize ammonia and a third zone to oxidize carbon monoxide and hydrocarbons and at least a portion of the platinum group metal is on a particulate refractory oxide support.

Another aspect of the invention pertains to a method of preparing a catalytic article for treatment of an exhaust stream containing NOx, the method comprising directly coating a first substantially unsupported platinum group metal on porous walls of a honeycomb substrate; drying and calcining the coated substrate to fix the first substantially unsupported platinum group metal onto the substrate; slurry coating a portion the porous walls with a washcoat layer containing a catalyst for selective catalytic reduction (SCR) of nitrogen oxides; and drying and calcining the coated substrate to fix the washcoat layer onto the substrate. In specific method embodiments, the slurry coating is formed on a zone between an inlet end and an outlet end of the substrate to provide three zones, a first zone to abate ammonia selective catalytic reduction, a second zone to oxidize ammonia and a third zone to oxidize carbon monoxide, and the substrate comprises a wall flow filter having gas permeable walls formed into a plurality of axially extending channels, each channel having one end plugged with any pair of adjacent channels plugged at opposite ends thereof.

In another aspect of the invention, a method of preparing a catalytic article having an inlet end and an outlet end for treatment of an exhaust stream containing NOx is provided. In one embodiment, the method comprises slurry coating a first washcoat layer containing a platinum group metal adjacent the outlet end porous walls of a honeycomb substrate; slurry coating the porous walls with a second washcoat layer containing a catalyst for selective catalytic reduction (SCR) of nitrogen oxides, the second washcoat layer extending from the inlet end and at least partially overlapping the first washcoat layer; and drying and calcining the coated substrate to fix the washcoat layers onto the substrate to provide a first zone to abate ammonia selective catalytic reduction, a second zone to oxidize ammonia and a third zone to oxidize carbon monoxide and hydrocarbons. In specific method embodiments, the substrate comprises a flow through substrate. In one or more embodiments, the substrate comprises a wall flow substrate filter having gas permeable walls formed into a plurality of axially extending channels, each channel having one end plugged with any pair of adjacent channels plugged at opposite ends thereof.

Another aspect of the invention pertains to a method of preparing a catalyst for treatment of an exhaust stream containing particulate matter, NOx and carbon monoxide the substrate including an inlet end and outlet end defining an axial length, the method comprising coating an outlet portion of the substrate with a first catalyst coating containing a platinum group metal effective for catalyzing the oxidation of carbon monoxide in the exhaust stream, the first catalyst coating layer extending from the outlet end of the substrate toward the inlet end over less than the entire axial length; drying and calcining the coated substrate to fix the first catalyst coating onto the outlet portion of the substrate; coating an inlet portion of the substrate with a second catalyst coating containing a selective catalytic reduction (SCR) catalyst effective for reducing NOx in the exhaust stream, the second catalyst coating extending from the inlet end of the substrate toward the outlet end over less than the entire axial length and overlapping a portion of the first catalyst coating layer; and drying and calcining the coated substrate to fix the second catalyst coating onto the inlet portion of the substrate.

BRIEF DESCRIPTION OF THE DRAWINGS

The following drawings illustrate embodiments of the invention. It is to be understood that the Figures are not intended to be to scale and that certain features such as monolith channels may be increased in size to show features according to embodiments of the invention.

DETAILED DESCRIPTION

Before describing several exemplary embodiments of the invention, it is to be understood that the invention is not limited to the details of construction or process steps set forth in the following description. The invention is capable of other embodiments and of being practiced or being carried out in various ways.

As used in this specification and the appended claims, the singular forms "a", "an" and "the" include plural referents unless the context clearly indicates otherwise. Thus, for example, reference to "a catalyst" includes a mixture of two or more catalysts, and the like. As used herein, the term "abate" means to decrease in amount and "abatement" means a decrease in the amount, caused by any means. Where they appear herein, the terms "exhaust stream" and "engine exhaust stream" refer to the engine out effluent as well as to the effluent downstream of one or more other catalyst system components including but not limited to a diesel oxidation catalyst and/or soot filter.

An aspect of the invention pertains to a catalyst. According to one or more embodiments, the catalyst may be disposed on a monolithic substrate as a washcoat layer. As used herein and as described in Heck, Ronald and Robert Farrauto, *Catalytic Air Pollution Control*, New York: Wiley-Interscience, 2002, pp. 18-19, a washcoat layer includes a compositionally distinct layer of material disposed on the surface of the monolithic substrate or an underlying washcoat layer. A catalyst can contain one or more washcoat layers, and each washcoat layer can have unique chemical catalytic functions.

In one or more embodiments, bifunctional catalysts are provided. According to one aspect of the invention, a bifunctional catalyst is provided that comprises a modular catalyst system with physically separate compositions for the SCR function and the $NH_3$ oxidation function. According to one or more embodiments, such modular catalyst systems permit greater flexibility to independently tune the kinetics of the two functions. By doing this, catalyst physical structure can be used to control the sequence of chemical catalytic events, to increase conversion of $NO_x$ and $NH_3$, and to increase selectivity to $N_2$. The catalyst compositions for the SCR function and $NH_3$ oxidation function can reside in discrete washcoat layers on the substrate or, alternatively, the compositions for the SCR and $NH_3$ oxidation functions can reside in discrete longitudinal zones on the substrate.

The term "SCR function" will be used herein to refer to a chemical process described by the stoichiometric Eq 1.

$$4NO_x + 4NH_3 + (3-2x)O_2 \rightarrow 4N_2 + 6H_2O \qquad \text{Eq 1}$$

More generally it will refer to any chemical process in which $NO_x$ and $NH_3$ are combined to produce preferably $N_2$. The term "SCR composition" refers to a material composition effective to catalyze the SCR function. The term "$NH_3$ oxidation function" will be used herein to refer to a chemical process described by Eq 2.

$$4NH_3 + 5O_2 \rightarrow 4NO + 6H_2O \qquad \text{Eq 2}$$

More generally, it will refer to a process in which $NH_3$ is reacted with oxygen to produce NO, $NO_2$, $N_2O$, or preferably $N_2$. The term "$NH_3$ oxidation composition" refers to a material composition effective to catalyze the $NH_3$ oxidation function.

Figure 1:
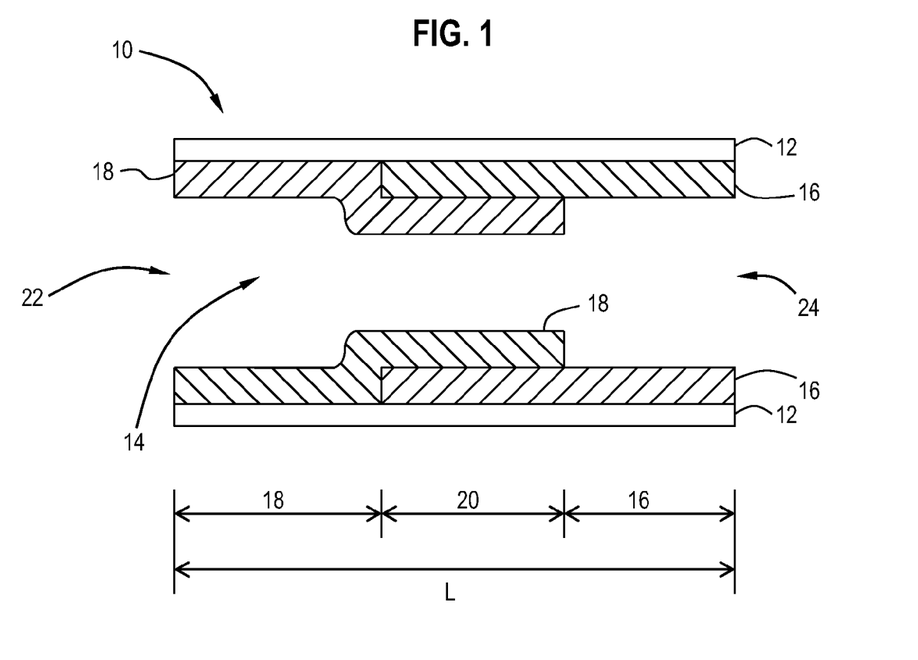
FIG. 1 shows a schematic of a catalyst monolith and the washcoat geometry in an individual monolith channel after coating with both a first and second catalyst.

With reference to FIG. 1, one or more embodiments of the invention are directed to catalytic articles 10 for treating an exhaust gas stream containing particulate matter, hydrocarbons, CO and ammonia. The catalytic articles comprise a substrate 12, often referred to as a carrier or carrier substrate. The substrate 12 has an inlet end 22 and an outlet end 24 defining an axial length L. The substrate 12 generally has a plurality of channels 14, of which only one is shown for clarity. A first catalyst coating 16 on the substrate includes a platinum group metal. The first catalyst coating 16 extends from the outlet end 24 of the substrate 12 toward the inlet end 22 over less than the entire axial length L of the substrate 12. A second catalyst coating 18 includes a catalyst for selective catalytic reduction (SCR) of nitrogen oxides. The second catalyst coating 18 extends from the inlet end 22 of the substrate 12 toward the outlet end 24 over less than the entire axial length L of the substrate 12. The second catalyst coating 18 overlaps 20 a portion of the first catalyst coating 16.

The platinum group metal of some embodiments is one or more of platinum, palladium, rhodium, ruthenium, osmium and iridium. In detailed embodiments, the platinum group metal is one or more of palladium, platinum and combinations thereof. In specific embodiments, the platinum group metal includes platinum, either alone or in combination with other platinum group metals.

According to detailed embodiments, at least a portion of the platinum group metal is supported on a particulate refractory oxide support. In some specific embodiments, the platinum group metal is directly supported on the substrate walls. As used in this specification and the appended claims, the term "directly supported on the substrate wall" means that the metal is not on a particulate support, such as by solution impregnation. Additionally, the term "substantially unsupported" means that the metal is directly supported on the substrate wall. For example, the metal is coated onto the substrate without an intervening particulate refractory oxide support.

Figure 2:
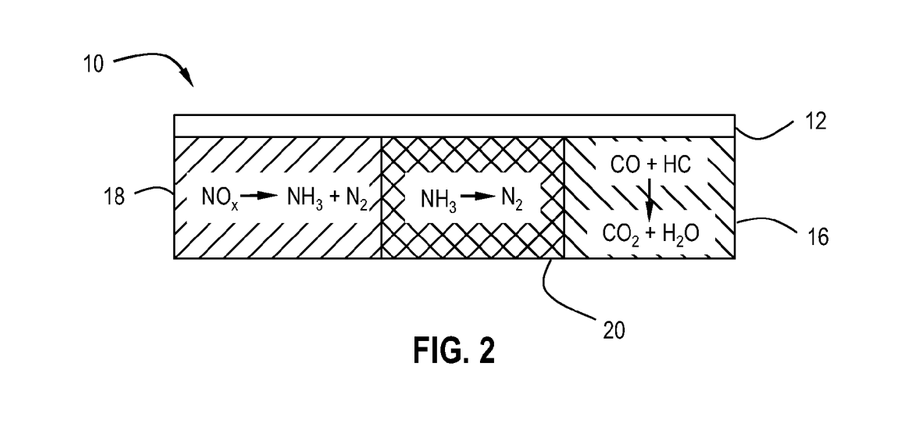
FIG. 2 is a schematic view illustrating the conversion of $NH_3$ to $N_2$ and CO, HC to $CO_2$ in a catalyst system according to one or more embodiments.

In detailed embodiments, the first catalyst coating and second catalyst coating overlap to form three zones 16, 18 and 20. As shown in FIG. 2, the first zone 18 removes NOx by selective catalytic reduction. The second zone 20 oxidizes ammonia and the third zone 16 oxidizes carbon monoxide and hydrocarbons. To allow for the oxidation of CO and HC, the third zone must be accessible to the CO and HC to allow for lightoff and oxidation.

In detailed embodiments, each of the three zones individually occupies in the range of about 10 to about 80% of the axial length of the substrate. In specific embodiments, each of the three zones occupy ⅓ of the axial length of the substrate.

The Substrate

According to one or more embodiments, the substrate for the catalyst may be any of those materials typically used for preparing automotive catalysts and will typically comprise a metal or ceramic honeycomb structure. Any suitable substrate may be employed, such as a monolithic flow-through substrate and having a plurality of fine, parallel gas flow passages extending from an inlet to an outlet face of the substrate, such that passages are open to fluid flow. The passages, which are essentially straight paths from their fluid inlet to their fluid outlet, are defined by walls on which the catalytic material is coated as a "washcoat" so that the gases flowing through the passages contact the catalytic material. The flow passages of the monolithic substrate are thin-walled channels which can be of any suitable cross-sectional shape such as trapezoidal, rectangular, square, sinusoidal, hexagonal, oval, circular, etc. Such structures may contain from about 60 to about 1200 or more gas inlet openings (i.e., "cells") per square inch of cross section (cpsi). A representative commercially-available flow-through substrate is the Corning 400/6 cordierite material, which is constructed from cordierite and has 400 cpsi and wall thickness of 6 mil. However, it will be understood that the invention is not limited to a particular substrate type, material, or geometry.

Ceramic substrates may be made of any suitable refractory material, e.g., cordierite, cordierite-α alumina, silicon nitride, zircon mullite, spodumene, alumina-silica magnesia, zircon silicate, sillimanite, magnesium silicates, zircon, petalite, α alumina, aluminosilicates and the like.

The substrates useful for the catalysts according to one or more embodiments of the present invention may also be metallic in nature and be composed of one or more metals or metal alloys. Exemplary metallic supports include the heat resistant metals and metal alloys such as titanium and stainless steel as well as other alloys in which iron is a substantial or major component. Such alloys may contain one or more of nickel, chromium and/or aluminum, and the total amount of these metals may comprise at least 15 wt. % of the alloy, e.g., 10-25 wt. % of chromium, 3-8 wt. % of aluminum and up to 20 wt. % of nickel. The alloys may also contain small or trace amounts of one or more other metals such as manganese, copper, vanadium, titanium and the like. The metallic substrates may be employed in various shapes such as corrugated sheet or monolithic form. A representative commercially-available metal substrate is manufactured by Emitec. However, it will be understood that the invention is not limited to a particular substrate type, material, or geometry. The surface of the metal substrates may be oxidized at high temperatures, e.g., 1000° and higher, to form an oxide layer on the surface of the substrate, improving the corrosion resistance of the alloy. Such high temperature-induced oxidation may also enhance the adherence of the refractory metal oxide support and catalytically-promoting metal components to the substrate.

Wall flow substrates useful for supporting the SCR catalyst compositions according to embodiments of the invention have a plurality of fine, substantially parallel gas flow passages extending along the longitudinal axis of the substrate. Typically, each passage is blocked at one end of the substrate body, with alternate passages blocked at opposite end-faces. Such monolithic carriers may contain up to about 700 or more flow passages (or "cells") per square inch of cross section, although far fewer may be used. For example, the carrier may have from about 7 to 600, more usually from about 100 to 400, cells per square inch ("cpsi"). The cells can have cross sections that are rectangular, square, circular, oval, triangular, hexagonal, or are of other polygonal shapes. Wall flow substrates typically have a wall thickness between 0.002 and 0.1 inches. Suitable wall flow substrates have wall thicknesses of between 0.002 and 0.015 inches.

Suitable wall flow filter substrates are composed of ceramic-like materials such as cordierite, alpha.-alumina, silicon carbide, silicon nitride, zirconia, mullite, spodumene, alumina-silica-magnesia or zirconium silicate, or of porous, refractory metal. Wall flow substrates may also be formed of ceramic fiber composite materials. Suitable wall flow substrates are formed from cordierite and silicon carbide. Such materials are able to withstand the environment, particularly high temperatures, encountered in treating the exhaust streams. The wall flow filter may be coated with SCR catalyst for it entire axial length, or a portion of the total axial length of the filter in a zone coated configuration.

Suitable wall flow substrates for use in the inventive system include thin porous walled honeycombs (monoliths) through which the fluid stream passes without causing too great an increase in back pressure or pressure across the article. Normally, the presence of a clean wall flow article will create a back pressure of 1 inch water column to 10 psig. In an embodiment, ceramic wall flow substrates used in the system are formed of a material having a porosity of at least 40% or 45% (e.g., from 40% to 80%) having a mean pore size of at least 5 microns (e.g., from 5 to 30 microns). In specific embodiments, such materials have a porosity of at least 50% (e.g., from 50% to 80%). The porosity of the material that forms the walls can be defined by density of the wall versus the theoretical density of material. In specific embodiments, the substrates have a porosity of at least 55% and have a mean pore size of at least 10 microns. When substrates with these porosities and these mean pore sizes are coated with the techniques described below, adequate levels of SCR catalyst compositions can be loaded onto the substrates to achieve excellent $NO_x$ conversion efficiency. These substrates are still able retain adequate exhaust flow characteristics, i.e., acceptable back pressures, despite the SCR catalyst loading. U.S. Pat. No. 4,329,162 is herein incorporated by reference with respect to the disclosure of suitable wall flow substrates. The substrate 12 can also be a high efficiency filter which removes at least about 70% of the particulate matter in the gas stream.

Typical wall flow filters in commercial use are typically formed with lower wall porosities, e.g., from about 35% to 50%, than the wall flow filters utilized in the invention. In general, the pore size distribution of commercial wall flow filters is typically very broad with a mean pore size smaller than 17 microns.

SCR Composition

In accordance with one or more embodiments of the invention, a component effective to catalyze the SCR function (herein referred to as an "SCR component") is utilized in a washcoat as part of a $NO_x$ abatement catalyst composition. Typically, the SCR component is part of a composition that includes other components in a washcoat. However, in one or more embodiments the $NO_x$ abatement catalyst composition may include only the SCR component.

In some embodiments, the invention utilizes an SCR component which includes a microporous inorganic framework or molecular sieve onto which a metal from one of the groups VB, VIB, VIIB, VIIIB, IB, or IIB of the periodic table has been deposited onto extra-framework sites on the external surface or within the channels, cavities, or cages of the molecular sieves. Metals may be in one of several forms, including, but not limited to, zerovalent metal atoms or clusters, isolated cations, mononuclear or polynuclear oxycations, or as extended metal oxides. In specific embodiments, the metals include iron, copper, and mixtures or combinations thereof.

In certain embodiments, the SCR component contains in the range of about 0.10% and about 10% by weight of a group VB, VIB, VIIB, VIIIB, IB, or IIB metal located on extraframework sites on the external surface or within the channels, cavities, or cages of the molecular sieve. In preferred embodiments, the extraframework metal is present in an amount of in the range of about 0.2% and about 5% by weight.

The microporous inorganic framework may consist of a microporous aluminosilicate or zeolite having any one of the framework structures listed in the *Database of Zeolite Structures* published by the International Zeolite Association (IZA). The framework structures include, but are not limited to those of the CHA, FAU, BEA, MFI, MOR types. Non-limiting examples of zeolites having these structures include chabazite, faujasite, zeolite Y, ultrastable zeolite Y, beta zeolite, mordenite, silicalite, zeolite X, and ZSM-5. Some embodiments utilize aluminosilicate zeolites that have a silica/alumina molar ratio (defined as $SiO_2/Al_2O_3$ and abbreviated as SAR) from at least about 5, preferably at least about 20, with useful ranges of from about 10 to 200.

In a specific embodiment, the SCR component includes an aluminosilicate molecular sieve having a CHA crystal framework type, an SAR greater than about 15, and copper content exceeding about 0.2 wt %. In a more specific embodiment, the SAR is at least about 10, and copper content from about 0.2 wt % to about 5 wt %. Zeolites having the CHA structure, include, but are not limited to natural chabazite, SSZ-13, LZ-218, Linde D, Linde R, Phi, ZK-14, and ZYT-6. Other suitable zeolites are also described in U.S. Pat. No. 7,601,662 entitled "Copper CHA Zeolite Catalysts," the entire content of which is incorporated herein by reference.

According to one or more embodiments of the invention, SCR compositions which include non-zeolitic molecular sieves are provided. As used herein, the terminology "non zeolitic molecular sieve" refers to corner sharing tetrahedral frameworks where at least a portion of the tetrahedral sites are occupied by an element other than silicon or aluminum. Non-limiting examples of such molecular sieves include aluminophosphates and metal-aluminophosphates, wherein metal could include silicon, copper, zinc or other suitable metals. Such embodiments may include a non-zeolitic molecular sieve having a crystal framework type selected from CHA, FAU, MFI, MOR, and BEA.

Non-zeolitic compositions can be utilized in the SCR component according to embodiments of the present invention. Specific non-limiting examples include sillicoaluminophosphates SAPO-34, SAPO-37, SAPO-44. Synthesis of synthetic form of SAPO-34 is described in U.S. Pat. No. 7,264,789, which is hereby incorporated by reference. A method of making yet another synthetic non-zeolitic molecular sieve having chabazite structure, SAPO-44, is described in U.S. Pat. No. 6,162,415, which is hereby incorporated by reference.

SCR compositions consisting of vanadium supported on a refractory metal oxide such as alumina, silica, zirconia, titania, ceria and combinations thereof are also well known and widely used commercially in mobile applications. Typical compositions are described in U.S. Pat. Nos. 4,010,238 and 4,085,193, of which the entire contents are incorporated herein by reference. Compositions used commercially, especially in mobile applications, comprise $TiO_2$ on to which $WO_3$ and $V_2O_5$ have been dispersed at concentrations ranging from 5 to 20 wt. % and 0.5 to 6 wt. %, respectively. These catalysts may contain other inorganic materials such as $SiO_2$ and $ZrO_2$ acting as binders and promoters.

$NH_3$ Oxidation Composition

In accordance with one or more embodiments of the invention, a composition effective to catalyze the $NH_3$ oxidation function (herein referred to as an "$NH_3$ oxidation component") is utilized in a $NO_x$ abatement catalyst. The ammonia contained in an exhaust gas stream is reacted with oxygen over the $NH_3$ oxidation component to form $N_2$ according to Eq 1.

According to one or more embodiments, the $NH_3$ oxidation component may be a supported precious metal component which is effective to remove ammonia from the exhaust gas stream. In one or more embodiments, the precious metal component includes ruthenium, rhodium, iridium, palladium, platinum, silver or gold. In specific embodiments, the precious metal component includes physical mixtures and chemical and atomically-doped combinations of ruthenium, rhodium, iridium, palladium, platinum, silver and gold. In a more specific embodiment, the precious metal component includes platinum. In an even more specific embodiment, the platinum is present in an amount in the range of about 0.008% to about 2% by wt (metal), based on Pt support loading.

According to one or more embodiments, the precious metal component is deposited on a high surface area refractory metal oxide support. Examples of suitable high surface area refractory metal oxides include, but are not limited to, alumina, silica, titania, ceria, and zirconia, as well as physical mixtures, chemical combinations and/or atomically-doped combinations thereof. In specific embodiments, the refractory metal oxide may contain a mixed oxide such as silica-alumina, amorphous or crystalline aluminosilicates, alumina-zirconia, alumina-lanthana, alumina-chromia, alumina-baria, alumina-ceria, and the like. An exemplary refractory metal oxide comprises high surface area γ-alumina having a specific surface area of about 50 to about 300 $m^2/g$.

As otherwise mentioned herein, the $NH_3$ oxidation component may include a zeolitic or non-zeolitic molecular sieve, which may have any one of the framework structures listed in the *Database of Zeolite Structures* published by the International Zeolite Association (IZA). The framework structures include, but are not limited to those of the CHA, FAU, BEA, MFI, and MOR types. In one embodiment, a molecular sieve component may be physically mixed with an oxide-supported platinum component. In an alternative embodiment, platinum may be distributed on the external surface or in the channels, cavities, or cages of the molecular sieve.

The $NH_3$ oxidation composition may contain a component active for the ammonia SCR function. The SCR component may consist of any one of the SCR components described in the preceding section. In one embodiment, the $NH_3$ oxidation component includes a physical mixture of an oxide-supported platinum component and an SCR component. In an alternative embodiment, platinum may be distributed on the external surface or in the channels, cavities, or cages of the SCR component. In one or more embodiments, the catalytic article includes two layers for $NH_3$ oxidation, a first layer including a platinum group metal component, for example, Pt, and a second layer including a molecular sieve, for example, a zeolite.

Washcoat Layers

According to one or more embodiments, the SCR component and the $NH_3$ oxidation component can be applied in washcoat layers, which are coated upon and adhered to the substrate.

For example, a washcoat layer of a composition containing an $NH_3$ oxidation component may be formed by preparing a mixture or a solution of a platinum precursor in a suitable solvent, e.g. water. Generally, from the point of view of economics and environmental aspects, aqueous solutions of soluble compounds or complexes of the platinum are preferred. Typically, the platinum precursor is utilized in the form of a compound or complex to achieve dispersion of the platinum precursor on the support. For purposes of the present invention, the term "platinum precursor" means any compound, complex, or the like which, upon calcination or initial phase of use thereof, decomposes or otherwise converts to a catalytically active form. Suitable platinum complexes or compounds include, but are not limited to platinum chlorides (e.g. salts of $[PtCl_4]^{2-}$, $[PtCl_6]^{2-}$), platinum hydroxides (e.g. salts of $[Pt(OH)_6]^{2-}$), platinum ammines (e.g. salts of $[Pt(NH_3)_4]^{2+}$, $]Pt(NH_3)_4]^{4+}$), platinum hydrates (e.g. salts of $[Pt(OH_2)_4]^{2+}$), platinum bis(acetylacetonates), and mixed compounds or complexes (e.g. $[Pt(NH_3)_2(Cl)_2]$). A representative commercially-available platinum source is 99% ammonium hexachloroplatinate from Strem Chemicals, Inc., which may contain traces of other precious metals. However, it will be understood that this invention is not restricted to platinum precursors of a particular type, composition, or purity. A mixture or solution of the platinum precursor is added to the support by one of several chemical means. These include impregnation of a solution of the platinum precursor onto the support, which may be followed by a fixation step incorporating acidic component (e.g. acetic acid) or a basic component (e.g. ammonium hydroxide). This wet solid can be chemically reduced or calcined or be used as is. Alternatively, the support may be suspended in a suitable vehicle (e.g. water) and reacted with the platinum precursor in solution. This latter method is more typical when the support is a zeolite, and it is desired to fix the platinum precursor to ion-exchange sites in the zeolite framework. Additional processing steps may include fixation by an acidic component (e.g. acetic acid) or a basic component (e.g. ammonium hydroxide), chemical reduction, or calcination.

In one or more embodiments utilizing washcoat layers of an SCR composition, the layer can contain a zeolitic or non-zeolitic molecular sieve on which has been distributed a metal from one of the groups VB, VIB, VIIB, VIIIB, IB, or IIB of the periodic table. An exemplary metal of this series is copper. Exemplary molecular sieves, include, but are not limited to zeolites having one of the following crystal structures CHA, BEA, FAU, MOR, and MFI. A suitable method for distributing the metal on the zeolite is to first prepare a mixture or a solution of the metal precursor in a suitable solvent, e.g. water. Generally, from the point of view of economics and environmental aspects, aqueous solutions of soluble compounds or complexes of the metal are preferred. For purposes of the present invention, the term "metal precursor" means any compound, complex, or the like which, can be dispersed on the zeolite support to give a catalytically-active metal component. For the exemplary Group IB metal copper, suitable complexes or compounds include, but are not limited to anhydrous and hydrated copper sulfate, copper nitrate, copper acetate, copper acetylacetonate, copper oxide, copper hydroxide, and salts of copper ammines (e.g. $[Cu(NH_3)_4]^{2+}$). A representative commercially-available copper source is 97% copper acetate from Strem Chemicals, Inc., which may contain traces of other metals, particularly iron and nickel. However, it will be understood that this invention is not restricted to metal precursors of a particular type, composition, or purity. The molecular sieve can be added to the solution of the metal component to form a suspension. This suspension can be allowed to react so that the copper component is distributed on the zeolite. This may result in copper being distributed in the pore channels as well as on the outer surface of the molecular sieve. Copper may be distributed as copper (II) ions, copper (I) ions, or as copper oxide. After the copper is distributed on the molecular sieve, the solids can be separated from the liquid phase of the suspension, washed, and dried. The resulting copper-containing molecular sieve may also be calcined to fix the copper.

To apply a washcoat layer according to one or more embodiments of the invention, finely divided particles of a catalyst, consisting of the SCR component, the $NH_3$ oxidation component, or a mixture thereof, are suspended in an appropriate vehicle, e.g., water, to form a slurry. Other promoters and/or stabilizers and/or surfactants may be added to the slurry as mixtures or solutions in water or a water-miscible vehicle. In one or more embodiments, the slurry is comminuted to result in substantially all of the solids having particle sizes of less than about 10 microns, i.e., in the range of about 0.1-8 microns, in an average diameter. The comminution may be accomplished in a ball mill, continuous Eiger mill, or other similar equipment. In one or more embodiments, the suspension or slurry has a pH of about 2 to less than about 7. The pH of the slurry may be adjusted if necessary by the addition of an adequate amount of an inorganic or an organic acid to the slurry. The solids content of the slurry may be, e.g., about 20-60 wt. %, and more particularly about 35-45 wt. %. The substrate may then be dipped into the slurry, or the slurry otherwise may be coated on the substrate, such that there will be deposited on the substrate a desired loading of the catalyst layer. Thereafter, the coated substrate is dried at about 100° C. and calcined by heating, e.g., at 300-650° C. for about 1 to about 3 hours. Drying and calcination are typically done in air. The coating, drying, and calcination processes may be repeated if necessary to achieve the final desired gravimetric amount of the catalyst washcoat layer on the support. In some cases, the complete removal of the liquid and other volatile components may not occur until the catalyst is placed into use and subjected to the high temperatures encountered during operation.

After calcining, the catalyst washcoat loading can determined through calculation of the difference in coated and uncoated weights of the substrate. As will be apparent to those of skill in the art, the catalyst loading can be modified by altering the solids content of the coating slurry and slurry viscosity. Alternatively, repeated immersions of the substrate in the coating slurry can be conducted, followed by removal of the excess slurry as described above.

Method of Preparing a Catalyst

Figure 3:
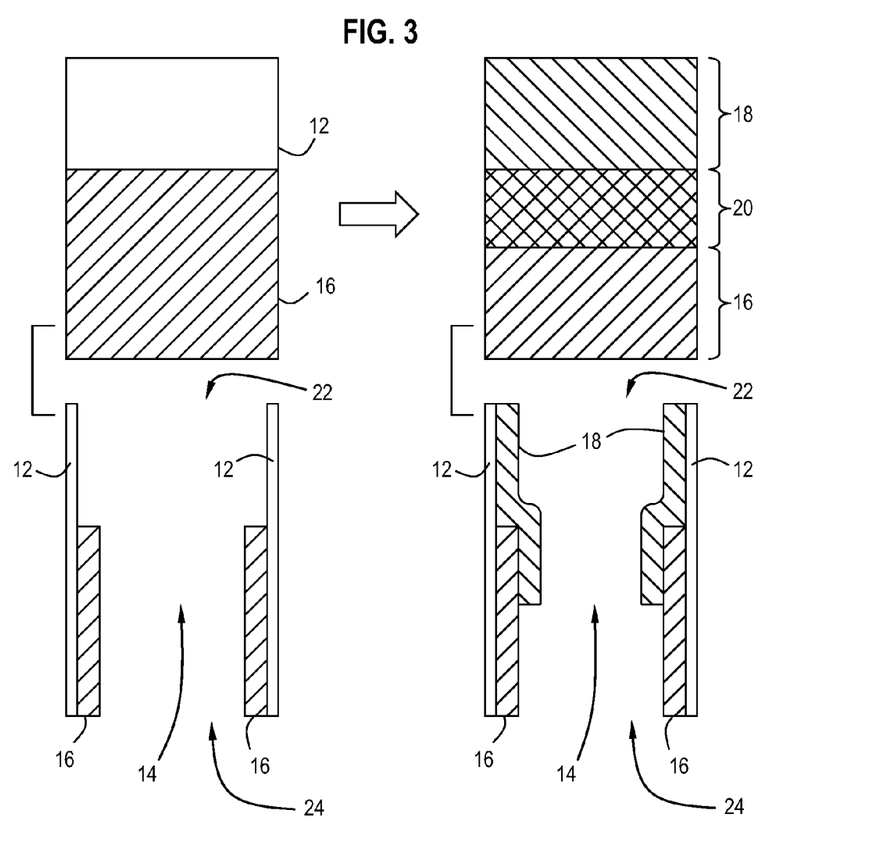
FIG. 3 shows a schematic of a catalyst monolith and the washcoat geometry in an individual monolith channel after coating the entire substrate from FIG. 1.

As shown in FIG. 3, a catalyst or catalytic article according to one or more embodiments of the present invention can be prepared in a two-step process. In the first step, a carrier substrate 12, which, in specific embodiments, is a honeycomb substrate with porous walls and containing channels 14 of dimensions in the range of about 100 channels/in$^2$ and 1000 channels/in$^2$, is directly coated with a platinum group metal. For ease of illustration, only a single channel 14 is shown. In detailed embodiments, the platinum group metal is coated without an intervening particulate refractory oxide support. For ease of illustration, this is shown as the first catalyst coating 16. The coated substrate 12 is dried and calcined to fix the substantially unsupported platinum group metal onto the substrate 12. A portion of the porous walls of the substrate 12 is then slurry coated with a second catalyst coating 18 washcoat layer containing a catalyst for selective catalytic reduction of nitrogen oxides. The substrate 12 is dried and calcined to fix the second catalyst coating 18 washcoat layer onto the substrate 12.

In detailed embodiments, the second catalyst coating 18 is formed on a zone between an inlet end 22 and an outlet end 24 of the substrate 12 to provide three zones, a first zone to abate ammonia selective catalytic reduction, a second zone to oxidize ammonia and a third zone to oxidize carbon monoxide. In specific embodiments, the substrate 12 comprises a wall flow filter having gas permeable walls formed into a plurality of axially extending channels, each channel having one end plugged with any pair of adjacent channels plugged at opposite ends thereof.

Additional embodiments of the invention are directed to methods of preparing a catalytic article having an inlet end 22 and an outlet end 24 for treatment of an exhaust stream containing NOx. A first washcoat layer 16 is slurry coated onto the walls of the honeycomb substrate 12 adjacent the outlet end 24 of the substrate 12. In detailed embodiments, the first washcoat layer 16 comprises a platinum group metal. The porous walls of the substrate 12 are then slurry coated with a second washcoat layer 18 containing a catalyst for selective catalytic reduction (SCR) of nitrogen oxides. The second washcoat layer 18 extends from the inlet end 22 and at least partially overlapping the first washcoat layer 16. The coated substrate 12 is dried and calcined to fix the washcoat layers 16, 18 onto the substrate 12. This provides a first zone to abate ammonia through selective catalytic reduction, a second zone to oxidize ammonia and a third zone to oxidize carbon monoxide and hydrocarbons. In detailed embodiments, the substrate 12 comprises a flow through substrate.

In one or more specific embodiments, the substrate 12 comprises a wall flow substrate filter having gas permeable walls formed into a plurality of axially extending channels, each channel having one end plugged with any pair of adjacent channels plugged at opposite ends thereof.

Further embodiments of the invention are directed to methods of preparing a catalyst for treatment of an exhaust stream containing particulate matter, NOx and carbon monoxide. The substrate 12 includes an inlet end 22 and outlet end 24 defining an axial length L. An outlet portion of the substrate 12 is coated with a first catalyst coating 16 containing a platinum group metal effective for catalyzing the oxidation of carbon monoxide in the exhaust stream. The first catalyst coating layer 16 extends from the outlet end 24 of the substrate 12 toward the inlet end 22 over less than the entire axial length L. The coated substrate 12 is dried and calcined to fix the first catalyst coating 16 onto the outlet portion of the substrate 12. An inlet portion of the substrate 12 is coated with a second catalyst coating 18 containing a selective catalytic reduction (SCR) catalyst effective for reducing NOx in the exhaust stream. The second catalyst coating 18 extends from the inlet end 22 of the substrate 12 toward the outlet end 24 over less than the entire axial length L and overlaps a portion of the first catalyst coating layer 16. The coated substrate 12 is dried and calcined to fix the second catalyst coating 18 onto the inlet portion of the substrate 12.

Method for Treating Emissions

Another aspect of the present invention includes a method of treating emissions produced in the exhaust gas stream of an engine. The exhaust gas stream can include one or more of $NO_x$, CO, hydrocarbons, and ammonia. In one or more embodiments, the method includes injecting ammonia or an ammonia precursor into an exhaust gas stream and then passing the exhaust gas stream first through an upstream SCR zone described herein to remove $NO_x$ by the SCR function. In such embodiments, the exhaust gas stream is then passed through a midstream AMOx zone to remove ammonia by the $NH_3$ oxidation function. The midstream catalyst zone may also be followed by a downstream zone which oxidizes one or more of CO and hydrocarbons.

In one embodiment, the upstream SCR zone, the midstream AMOx zone and the downstream DOC zone are disposed on a single catalyst substrate. The SCR zone may be present in the range of about 50% to about 90% of the substrate length or in the range of about 20% to about 90% of the substrate length, and consists of only the SCR component. The AMOx zone comprises in the range of about 5% to about 50% of the substrate length, and includes an undercoat layer containing the $NH_3$ oxidation component and an overcoat layer containing the SCR component. The downstream DOC zone comprises in the range of about 5% to about 50% of the substrate length, and includes an oxidation component.

In an alternative embodiment of the method, the upstream SCR zone is disposed on one carrier substrate, and the downstream AMOx zone is disposed on a separate carrier substrate. In this embodiment, the AMOx zone is prepared as a standalone AMOx as described above. The volume of the downstream standalone AMOx catalyst is in the range of about 10% to about 100% of the volume of the upstream SCR catalyst, and consists of an undercoat layer containing the $NH_3$ oxidation component and an overcoat layer containing the SCR component.

In both embodiments above, the AMOx zone includes two compositionally and functionally distinct layers. The undercoat layer includes a supported precious metal component and functions to oxidize ammonia according to Eq 2. Ammonia molecules that are desorbed from an SCR catalyst under conditions where it cannot be quickly consumed by a molecule of $NO_x$ (e.g., under a thermal desorption event) move down the channel 14 while colliding with the washcoat layer 18 in the upstream zone, comprising an SCR catalyst. The molecule can diffuse into and out of the washcoat layer 18, but it is not otherwise converted by the catalyst until it enters the downstream zone and contacts the undercoat layer 16, which contains a composition that includes an $NH_3$ oxidation component. In the undercoat layer 16, the ammonia is initially converted to NO, which subsequently may diffuse to the overcoat layer 18. In the overcoat layer containing an SCR catalyst composition, the NO may react with $NH_3$ to form $N_2$, thereby increasing the net selectivity to $N_2$.

Placing the supported precious metal in the bottom washcoat layer underneath the SCR component in the overcoat layer restricts NO to be generated only in the undercoat layer. This has the effect of increasing the average residence lifetime of NO within the catalyst washcoat layers. As the residence time of the NO is increased, NO has a higher probability to collide with a molecule of ammonia in the SCR washcoat layer and to produce $N_2$, which is ultimately released from the catalyst.

In use, the upstream SCR zone 18 of the catalyst is primarily responsible for removing $NO_x$ emissions from the exhaust by ammonia selective catalytic reduction reaction. The downstream AMOx zone is primarily responsible for the ammonia oxidation function. As discussed otherwise herein, the downstream zone 20, having an overlayer of the SCR composition will have SCR activity and can further function in $NO_x$ abatement. In this manner, the AMOx zone can contribute to net $NO_x$ removal. In addition, at elevated temperatures, some SCR compositions, particularly copper-based SCR catalysts, can also have appreciable ammonia oxidation activity even in the absence of a precious metal component. Furthermore, copper-based SCR catalyst compositions can convert $NH_3$ to $N_2$ with high selectivity at temperatures above 350° C. In one or more embodiments, the SCR zone can thereby contribute to abatement of excess ammonia.

Emissions Treatment System

Figure 4:
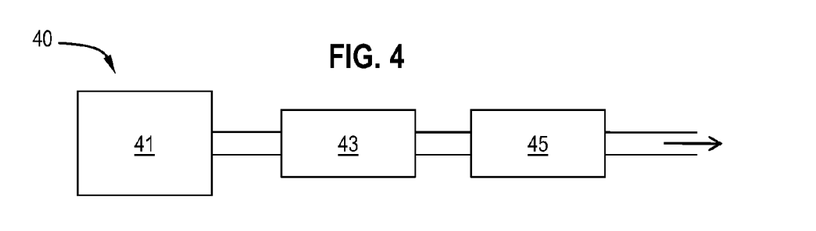
FIG. 4 is a schematic of an engine emission treatment system, in accordance with one embodiment of the present invention.

An aspect of the invention is directed to emissions treatment systems for treating exhaust gases emitted by a diesel engine. FIG. 4 shows one or more embodiments of the emissions treatment system 40 including a diesel engine 41 emitting an exhaust stream including particulate matter, NOx and carbon monoxide. A first substrate 45 has an inlet end and an outlet end defining an axial length. The first substrate 45 is positioned downstream of and in flow communication with the diesel engine 41. The first substrate 45 has a first catalyst coating including a platinum group metal, the first catalyst coating extending from the outlet end toward the inlet end over less than the entire axial length of the substrate, and a second catalyst coating including a catalyst for selective catalytic reduction (SCR) of nitrogen oxides, the second catalyst coating extending from the inlet end toward the outlet end over less than the entire axial length of the substrate and overlapping a portion of the first catalyst coating layer. In detailed embodiments, the first substrate 45 is selected from the group consisting of a wall-flow substrate and a flow-through substrate. In specific embodiments, at least a portion of the platinum group metal is on refractory metal oxide support. In further specific embodiments, the platinum group metal is platinum.

In one or more embodiments, there is an upstream substrate 43 coated with a catalyst for selective catalytic reduction of nitrogen oxides. The upstream substrate 43 is in flow communication with the exhaust stream from the diesel engine 41 and disposed between the diesel engine 41 and the first substrate 45. In detailed embodiments, the upstream substrate 43 comprises a honeycomb flow-through substrate. In specific embodiments, the upstream substrate 43 comprises a wall flow filter substrate having gas permeable walls formed into a plurality of axially extending channels, each channel having one end plugged with any pair of adjacent channels plugged at opposite ends thereof.

In some specific embodiments, the first catalyst and second catalyst overlap to form three zones. A first zone abates nitrogen oxides by selective catalytic reduction, a second zone oxidizes ammonia and a third zone oxidizes carbon monoxide and hydrocarbons, and the platinum group metal is directly supported on the substrate walls in the first zone and the third zone.

According to one or more detailed embodiments, the first substrate comprises a honeycomb flow through substrate and the first catalyst and second catalyst overlap to form three zones. The first zone abates nitrogen oxides by selective catalytic reduction, the second zone oxidizes ammonia and the third zone oxidizes carbon monoxide and hydrocarbons. At least a portion of the platinum group metal is on a particulate refractory oxide support.

In some specific embodiments, the first substrate is a wall flow filter substrate having gas permeable walls formed into a plurality of axially extending channels. Each channel has one end plugged with any pair of adjacent channels plugged at opposite ends thereof.

In one or more embodiments, there is a wall flow filter substrate having gas permeable walls formed into a plurality of axially extending channels in flow communication with and disposed between the diesel engine 41 and the first substrate 45. Each channel of the wall flow filter substrate 43 has one end plugged with any pair of adjacent channels plugged at opposite ends thereof coated with a hydrocarbon or CO oxidation catalyst.

Reference throughout this specification to "one embodiment," "certain embodiments," "one or more embodiments" or "an embodiment" means that a particular feature, structure, material, or characteristic described in connection with the embodiment is included in at least one embodiment of the invention. Thus, the appearances of the phrases such as "in one or more embodiments," "in certain embodiments," "in one embodiment" or "in an embodiment" in various places throughout this specification are not necessarily referring to the same embodiment of the invention. Furthermore, the particular features, structures, materials, or characteristics may be combined in any suitable manner in one or more embodiments.

Although the invention herein has been described with reference to particular embodiments, it is to be understood that these embodiments are merely illustrative of the principles and applications of the present invention. It will be apparent to those skilled in the art that various modifications and variations can be made to the method and apparatus of the present invention without departing from the spirit and scope of the invention. Thus, it is intended that the present invention include modifications and variations that are within the scope of the appended claims and their equivalents.

What is claimed is:

1. A catalytic article for treating an exhaust gas stream containing particulate matter, hydrocarbons, CO and ammonia, the article comprising:
    a substrate having an inlet end and an outlet end defining an axial length;
    a first catalyst coating including a platinum group metal, the first catalyst coating extending from the outlet end toward the inlet end over less than the entire axial length of the substrate; and
    a second catalyst coating including a catalyst for selective catalytic reduction (SCR) of nitrogen oxides, the second catalyst coating extending from the inlet end toward the outlet end over less than the entire axial length of the substrate and overlapping a portion of the first catalyst coating.

2. The catalytic article of claim 1, wherein the substrate is a flow-through substrate having a plurality of longitudinally extending passages formed by longitudinally extending walls bounding and defining said passages, and the platinum group metal is directly supported on the substrate walls.

3. The catalytic article of claim 2, wherein at least a portion of the platinum group metal is on a particulate refractory oxide support.

4. The catalytic article of claim 1, wherein the substrate is a wall-flow filter having gas permeable walls formed into a plurality of axially extending channels, each channel having one end plugged with any pair of adjacent channels plugged at opposite ends thereof, and the platinum group metal is directly supported on the substrate walls.

5. The catalytic article of claim 1, wherein the platinum group metal is platinum.

6. The catalytic article of claim 1, wherein the first catalyst coating and second catalyst coating overlap to form three zones, a first zone to remove NOx by selective catalytic reduction, a second zone to oxidize ammonia and a third zone to oxidize carbon monoxide and hydrocarbons.

7. The catalytic article of claim 6, wherein each of the three zones individually occupies in the range of about 10 to about 80% of the axial length of the substrate.

8. An emissions treatment system comprising:
    a diesel engine emitting an exhaust stream including particulate matter, NOx and carbon monoxide;
    a first substrate selected from the group consisting of a wall-flow substrate and a flow-through substrate; and
    the first substrate having an inlet end and an outlet end defining an axial length positioned downstream of and in flow communication with the diesel engine, the substrate having a first catalyst coating including a platinum group metal, the first catalyst coating extending from the outlet end toward the inlet end over less than the entire axial length of the substrate, and a second catalyst coating including a catalyst for selective catalytic reduction (SCR) of nitrogen oxides, the second catalyst coating extending from the inlet end toward the outlet end over less than the entire axial length of the substrate and overlapping a portion of the first catalyst coating layer.

9. The emissions treatment system of claim 8, wherein at least a portion of the platinum group metal is on refractory metal oxide support.

10. The emissions treatment system of claim 8, wherein the platinum group metal is platinum.

11. The emissions treatment system of claim 8, wherein there is an upstream substrate coated with a catalyst for selective catalytic reduction of nitrogen oxides disposed in flow communication with the exhaust stream and between the diesel engine and the first substrate.

12. The emissions treatment system of claim 11, wherein the upstream substrate comprises a wall flow filter substrate having gas permeable walls formed into a plurality of axially extending channels, each channel having one end plugged with any pair of adjacent channels plugged at opposite ends thereof, and the first substrate comprises a honeycomb flow through substrate and the first catalyst and second catalyst overlap to form three zones, a first zone to abate nitrogen oxides by selective catalytic reduction, a second zone to oxidize ammonia and a third zone to oxidize carbon monoxide and hydrocarbons, and at least a portion of the platinum group metal is on a particulate refractory oxide support.

13. The emissions treatment system of claim 11, the first catalyst and second catalyst overlap to form three zones, a first zone to abate nitrogen oxides by selective catalytic reduction, a second zone to oxidize ammonia and a third zone to oxidize carbon monoxide and hydrocarbons, and the platinum group metal is directly supported on the substrate walls in the first zone and the third zone.

14. The emissions treatment system of claim 11, wherein the first substrate is a wall flow filter substrate having gas permeable walls formed into a plurality of axially extending channels, each channel having one end plugged with any pair of adjacent channels plugged at opposite ends thereof.

15. The emissions treatment system of claim 8, wherein there is a wall flow filter substrate having gas permeable walls formed into a plurality of axially extending channels, each channel having one end plugged with any pair of adjacent channels plugged at opposite ends thereof coated with a hydrocarbon or CO oxidation catalyst disposed in flow communication with the exhaust stream and between the diesel engine and the porous substrate, and the first catalyst and second catalyst overlap to form three zones, a first zone to abate nitrogen oxides by selective catalytic reduction, a second zone to oxidize ammonia and a third zone to oxidize carbon monoxide and hydrocarbons and at least a portion of the platinum group metal is on a particulate refractory oxide support.

* * * * *